(12) United States Patent
Meiser et al.

(10) Patent No.: US 10,700,061 B2
(45) Date of Patent: *Jun. 30, 2020

(54) SEMICONDUCTOR DEVICE COMPRISING A FIRST TRANSISTOR AND A SECOND TRANSISTOR

(71) Applicant: Infineon Technologies AG, Neubiberg (DE)

(72) Inventors: Andreas Meiser, Sauerlach (DE); Dirk Ahlers, Munich (DE); Till Schloesser, München (DE)

(73) Assignee: Infineon Technologies AG (DE)

( * ) Notice: Subject to any disclaimer, the term of this patent is extended or adjusted under 35 U.S.C. 154(b) by 509 days.

This patent is subject to a terminal disclaimer.

(21) Appl. No.: 15/351,816

(22) Filed: Nov. 15, 2016

(65) Prior Publication Data

US 2017/0141105 A1     May 18, 2017

(30) Foreign Application Priority Data

Nov. 16, 2015  (DE) .................. 10 2015 119 771

(51) Int. Cl.
  *H01L 21/8234*   (2006.01)
  *H01L 27/088*    (2006.01)
  (Continued)

(52) U.S. Cl.
  CPC .... *H01L 27/088* (2013.01); *H01L 21/823481* (2013.01); *H01L 21/823487* (2013.01);
  (Continued)

(58) Field of Classification Search
  CPC ........ H01L 27/105–11597; H01L 27/085–098; H01L 27/0705–0722; H01L 27/0635;
  (Continued)

(56) References Cited

U.S. PATENT DOCUMENTS 6,373,097 B1 * 4/2002 Werner ................. H01L 27/088
                                                       257/329
7,375,395 B2    5/2008 Tihanyi
                (Continued)

FOREIGN PATENT DOCUMENTS

CN         103681850 A     3/2014
CN         103855222 A     6/2014
                (Continued)

*Primary Examiner* — Jarrett J Stark
(74) *Attorney, Agent, or Firm* — Design IP

(57) ABSTRACT

A semiconductor device includes a first transistor and a second transistor in a semiconductor substrate. The first transistor includes a first drain contact electrically connected to a first drain region, the first drain contact including a first drain contact portion and a second drain contact portion. The first drain contact portion includes a drain conductive material in direct contact with the first drain region. The second transistor includes a second source contact electrically connected to a second source region. The second source contact includes a first source contact portion and a second source contact portion. The first source contact portion includes a source conductive material in direct contact with the second source region.

17 Claims, 9 Drawing Sheets

(51) Int. Cl.
*H01L 29/78* (2006.01)
*H03K 17/687* (2006.01)

(52) U.S. Cl.
CPC ..... *H01L 29/7813* (2013.01); *H03K 17/6871* (2013.01); *H01L 21/823418* (2013.01)

(58) Field of Classification Search
CPC ......... H01L 27/0617–0623; H01L 21/823857; H01L 21/82385; H01L 21/823842; H01L 21/8236; H01L 21/823462; H01L 21/82345; H01L 21/823885; H01L 21/823487; H01L 29/7827; H01L 27/2454
See application file for complete search history.

(56) References Cited

U.S. PATENT DOCUMENTS

| | | | |
|---|---|---|---|
| 8,860,136 B2 | 10/2014 | Meiser et al. | |
| 8,969,955 B2 | 3/2015 | Ng et al. | |
| 9,859,418 B2* | 1/2018 | Meiser | H01L 29/7825 |
| 2009/0140763 A1* | 6/2009 | Kim | G01R 31/2621 |
| | | | 324/762.05 |
| 2009/0184352 A1* | 7/2009 | Yamaguchi | H01L 21/823487 |
| | | | 257/296 |
| 2010/0078764 A1* | 4/2010 | Gietler | H01L 21/743 |
| | | | 257/544 |
| 2010/0187605 A1* | 7/2010 | Haeberlen | H01L 21/823475 |
| | | | 257/337 |
| 2010/0315159 A1 | 12/2010 | Kocon et al. | |
| 2011/0241170 A1* | 10/2011 | Haeberlen | H01L 21/823475 |
| | | | 257/532 |
| 2012/0153300 A1* | 6/2012 | Lidow | H01L 21/743 |
| | | | 257/77 |
| 2012/0299092 A1* | 11/2012 | Zundel | H01L 21/823487 |
| | | | 257/334 |
| 2014/0151758 A1 | 6/2014 | Meiser et al. | |
| 2014/0167144 A1* | 6/2014 | Tsuchiko | H01L 21/823418 |
| | | | 257/329 |
| 2015/0137224 A1* | 5/2015 | Meiser | H01L 29/4175 |
| | | | 257/331 |
| 2017/0221885 A1* | 8/2017 | Sander | H01L 27/088 |
| 2020/0091154 A1 | 3/2020 | Yamazaki | |

FOREIGN PATENT DOCUMENTS

| | | |
|---|---|---|
| DE | 10 2004 041 198 A1 | 3/2006 |
| DE | 10 2004 045 966 A1 | 4/2006 |
| JP | 2013211557 A | 10/2013 |

* cited by examiner

SEMICONDUCTOR DEVICE COMPRISING A FIRST TRANSISTOR AND A SECOND TRANSISTOR

FIELD

The present disclosure relates generally to a semiconductor device, and, more particularly, to a semiconductor devices having transistors formed in one semiconductor substrate.

BACKGROUND

Semiconductor devices including transistors which are suitably connected to form half-bridges are commonly used in the field of power electronics. For example, half-bridges may be used for driving electro motors or switched mode power supplies.

Improved concepts for semiconductor devices including two transistors formed in one semiconductor substrate are being developed.

SUMMARY

According to an embodiment, a semiconductor device comprises a first transistor and a second transistor in a semiconductor substrate having a first main surface. The first transistor includes a first drain contact electrically connected to a first drain region. The first drain contact includes a first drain contact portion and a second drain contact portion. The first transistor further includes a first body region and a first drift zone along a direction parallel to the first main surface between a first source region and the first drain region and a first gate electrode in a first gate trench in the first main surface adjacent to the first body region. The second drain contact portion is disposed at a second main surface of the semiconductor substrate. The first drain contact portion includes a drain conductive material in direct contact with the first drain region. The first drain contact portion further includes a first portion of the semiconductor substrate between the drain conductive material and the second drain contact portion. The second transistor includes a second source contact electrically connected to a second source region. The second source contact includes a first source contact portion and a second source contact portion. The second transistor further includes a second body region and a second drift zone along a direction parallel to the first main surface between the second source region and a second drain region, and a second gate electrode in a second gate trench in the first main surface adjacent to the second body region. The second source contact portion is disposed at the second main surface of the semiconductor substrate. The first source contact portion includes a source conductive material in direct contact with the second source region. The first source contact portion further includes a second portion of the semiconductor substrate arranged between the source conductive material and the second source contact portion.

According to a further embodiment, a semiconductor device includes a first transistor and a second transistor in a semiconductor substrate having a first main surface. The first and the second transistors are of the same conductivity type. The first transistor includes a first source region adjacent to the first main surface and a first drain contact portion electrically connected to a first drain region. The second transistor includes a second drain region adjacent to the first main surface and a first source contact portion electrically connected to a second source region. The semiconductor substrate further includes a first semiconductor layer of a first conductivity type, the first drain contact portion and the first source contact portion being electrically connected to the first semiconductor layer. The semiconductor device further includes a buried layer of a second conductivity type between the first transistor and the first semiconductor layer, wherein the buried layer is absent from a region between the first semiconductor layer and the second transistor, or a buried layer of the second conductivity type between the first semiconductor layer and the second transistor, wherein the buried layer is absent from a region between the first semiconductor layer and the first transistor.

According to a further embodiment, a semiconductor device includes a transistor in a semiconductor substrate having a first main surface. The transistor includes a first drain contact portion electrically connected to a drain region, a body region and a drift zone along a first direction parallel to the first main surface between a source region and the drain region, and a gate electrode in a gate trench in the first main surface adjacent to the body region, a longitudinal axis of the gate trench extending in the first direction. The first drain contact portion includes a drain conductive material in direct contact with the drain region. The first drain contact portion further comprising a portion of the semiconductor substrate of a first conductivity type. The semiconductor substrate further includes a buried layer of a second conductivity type between the portion of the semiconductor substrate and the transistor.

According to a further embodiment, a semiconductor device comprising a transistor in a semiconductor substrate having a first main surface. The transistor includes a first source contact portion electrically connected to a source region, a body region and a drift zone along a first direction parallel to the first main surface between the source region and a drain region, and a gate electrode in a gate trench in the first main surface adjacent to the body region. A longitudinal axis of the gate trench extends in a first direction. The first source contact portion includes a source conductive material in direct contact with the source region, the first source contact portion further comprising a portion of the semiconductor substrate of a first conductivity type. The semiconductor substrate further includes a buried layer of a second conductivity type between the portion of the semiconductor substrate and the transistor.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

Figure 1:
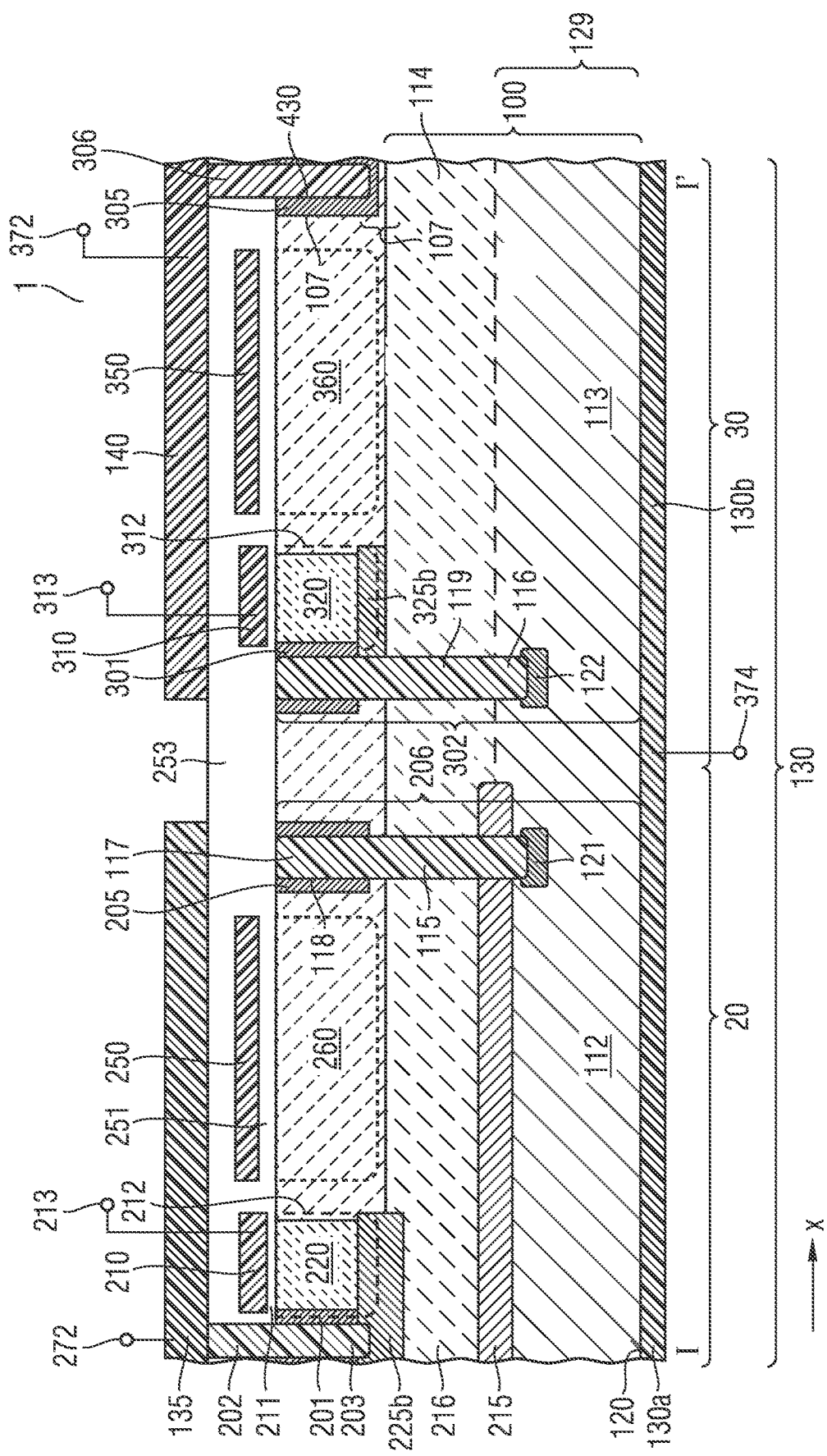
FIG. 1 shows a cross-sectional view of an example of the semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be re-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Throughout the present specification elements of field effect transistors are described. Generally, a field effect transistor includes a plurality of transistor cells that are connected in parallel. For example, as will be discussed in the following, each single transistor cell includes a single gate electrode, a body region and further components. The gate electrodes of the single transistor cells may be connected to a common terminal, e.g. a gate terminal. Further components of the single transistor cells, e.g. source regions, drain regions may be respectively connected to a common source terminal, a common drain terminal etc. The following description specifically describes the structure of the single transistor cells while generally referring to a transistor. However, as is to be clearly understood the single transistor cells are connected with a plurality of further transistor cells so as to form the respective transistor. Some of the components of the transistor cells such as the body regions may be formed separately from each other. Other components of the transistor cells such as the drain regions may be formed jointly for all of the transistor cells connected in parallel.

One or more embodiments may relate to a semiconductor device including two transistors that may be contacted from opposing horizontal surfaces of a semiconductor substrate.

FIG. 1 shows a cross-sectional view of a semiconductor device according to an embodiment. The semiconductor device 1 shown in FIG. 1 includes a first transistor 20 and a second transistor 30. The first transistor 20 and the second transistor 30 are formed in a common semiconductor substrate 100 having a first main surface 110 and a second main surface 120. The first transistor 20 includes a first source region 201, a first drain region 205, a first body region 220, and first drift zone 260. The first transistor 20 further includes a first gate electrode 210 which may be disposed in a first gate trench 212 formed in the first main surface 110 adjacent to the first body region 220. The first gate electrode 210 is configured to control a conductivity of a channel in the first body region 220. A longitudinal axis of the first gate trench 212 may extend in a first direction that is parallel to the first main surface, e.g., the x direction. In FIG. 1, the first gate trench 212 is indicated by dotted lines and is disposed before or behind the depicted plane of the drawing. The first body region 220 and the first drift zone 260 may be disposed along the first direction between the first source region 201 and the first drain region 205. The first transistor 20 further includes a first drain contact that is electrically connected to the first drain region 205. The first drain contact includes a first drain contact portion 206 and a second drain contact portion 130*a*. The second drain contact portion 130*a* is disposed at the second main surface 120 of the semiconductor substrate 100. The first drain contact portion 206 includes a drain conductive material 115 in direct contact with the first drain region 205, the first drain contact portion 206 further includes a first portion 112 of the semiconductor substrate arranged between the drain conductive material 115 and the second drain contact portion 130*a*.

The second transistor 30 includes a second source region 301, a second drain region 305, a second body region 320 and a second drift zone 360. The second transistor 30 further includes a second gate electrode 310 and a second gate trench 312 in the first main surface 110 adjacent to the second body region 320. The second gate electrode 310 is configured to control a conductivity of a channel in the second body region 320. A longitudinal axis of the second gate trench 312 may extend in a direction parallel to the first main surface of the semiconductor substrate, e.g. in the first direction. The second body region 320 and the second drift zone 360 may be disposed along the first direction between the second source region 301 and the second drain region 305. The second transistor 30 further includes a second source contact electrically connected to the second source region 301. The second source contact includes a first source contact portion 302 and a second source contact portion 130*b*. The second source contact portion 130*b* is disposed at the second main surface 120 of the semiconductor substrate. The first source contact portion 302 includes a source conductive material 116 in direct contact with the second source region 301, the first source contact portion 302 further includes a second portion 113 of the semiconductor substrate 100 arranged between the source conductive material 116 and the second source contact portion 130*b*.

The second transistor 30 may have a similar construction as the first transistor 20, with the exception that the second drain contact of the second transistor is implemented in a different manner. Further, the second source contact is implemented in a different manner so that the second source contact electrically connects the second source region 301 with the conductive layer (back side metallization layer) 130 disposed at the second main surface 120 of the semiconductor substrate. The first transistor 20 and the second transistor 30 are of the same conductivity type, for example having e.g., an n-type channel. Accordingly, the first body region 220 and the second body region 320 are of the same conductivity type, e.g., p-type.

According to the configuration shown in FIG. 1, the first portion 112 of the semiconductor substrate 100 and the second portion 113 of the semiconductor substrate form part of a first layer 129 adjacent to the second main surface 120. The first layer 129 electrically contacts a conductive layer 130 at the back side (second main surface) 120 of the semiconductor substrate. The first drain contact of the first transistor 20 may extend from the first drain region 205 into the semiconductor substrate 100 and may comprise a portion of the first layer 129. Likewise, the second source contact may extend from the second source region 301 into the semiconductor substrate 100 and may comprise a portion of the first layer 129. A common terminal 374 may be electrically connected with the conductive layer 130 which is disposed adjacent to the second main surface 120 of the semiconductor substrate. Accordingly, the first drain region 205 and the second source region 301 are electrically connected to a common terminal 374.

The first source region 201 is electrically connected via the first source contact 202 with a first source terminal 272. A first front side conductive layer 135 may be disposed adjacent to a first main surface 110 of the semiconductor substrate and may be electrically connected via the first source contact 202 to the first source region 201 of the first transistor 20. A second front side conductive layer 140 may be disposed adjacent to the first main surface 110 of the semiconductor substrate and may be electrically connected via the second drain contact 306 to the second drain region 305 of the second transistor 30. Accordingly, the semiconductor device illustrated in FIG. 1 implements a vertical semiconductor device and may be contacted from opposing sides of the semiconductor substrate 100. The first front side conductive layer 135 and the second front side conductive layer 140 may be implemented by metallization layers.

The first gate electrode 210 and the second gate electrode 310 are disposed adjacent to the first main surface 110 of the semiconductor substrate. Accordingly, the first and the second gate electrodes 210, 310 are configured to control a horizontal current flow. The semiconductor substrate 100 may comprise a first layer 129 comprising the first portion 112 and the second portion 113 that may be doped at the same doping concentration and with the same doping type. For example, the first portion 112 and the second portion 113 may be doped with the first conductivity type, e.g. pt-type. The semiconductor substrate 100 may additionally comprise a further substrate portion 114 of the first conductivity type at a lower doping concentration than the first and second substrate portions. The further substrate portion 114 may be disposed between the second substrate portion 113 and the drift zone 360 and the body region 320 of the second transistor 30. The semiconductor substrate 100 may further comprise a third substrate portion 216 between the first substrate portion 112 and the drift zone 260 and the body region 220 of the first transistor 20. The third substrate portion 216 may be of the second or first conductivity type. According to the embodiment shown in FIG. 1, the third substrate portion 216 is of the second conductivity type.

According to a further embodiment, the semiconductor device includes a buried layer 215 of the second conductivity type between the first portion 112 of the substrate and the first body region 220 and the first drift zone 260 of the first transistor 20. According to this embodiment, the buried layer 215 is not disposed between the second portion 113 of the substrate and the second body region 320 and the second drift zone 360 of the first transistor.

According to the embodiment shown in FIG. 1, the first and the second body regions 220, 320 are of the first conductivity type, and the first and the second drift zones 260, 360 are of the second conductivity type. As is further illustrated in FIG. 1, the third substrate portion 216 may be disposed between the buried layer 215 and the first body region 220 and the first drift zone 260. Due to the presence of a pn junction comprising the buried layer 215, the first transistor 20 may be effectively insulated from the first substrate portion 112 and the second substrate portion 113 which are electrically connected with the first drain region 205 via the first drain contact.

As a consequence, it becomes possible to integrate two transistors on a common or joint semiconductor substrate 100 so that the first drain region 205 and the second source region 301 are electrically connected to a common terminal. For example, the two transistors may be of the same conductivity type. In particular, the two transistors are integrated in such a manner that the two transistors may be contacted from the first main surface 110 and the second main surface 120, respectively. At the same time the first transistor 20 is effectively insulated from the first drain region 205 and the second source region 301.

The drain conductive material 115 may be disposed in a drain contact groove 117 that is formed in the first main surface 110. The drain contact groove 117 may extend from the first main surface 110 through the buried layer 215 to the first substrate portion 112. The source conductive material 116 may be disposed in a source contact groove 119 that may be formed in the first main surface 110. The source contact groove 119 may extend to the second substrate portion 113. The second source region 301 may be formed at the sidewall 172 of the source contact groove 119. The first drain region 205 may be formed at the sidewall 118 of the drain contact groove 117. The semiconductor device may further comprise a source contact trench 203 for contacting the first source region 201. The source contact trench 203 may be filled with a source conductive material 115. The source contact trench 203 extends from the first main surface 110 into the semiconductor substrate, e.g. to a depth that at least corresponds to a depth of the first source region 201. The source contact groove 119 of the second transistor 30 extends to a deeper depth than the source contact trench 203.

The buried layer 215 of the second conductivity type may be doped at a high doping concentration. For example, the doping concentration may be higher than 1e19 $cm^{-3}$. According to further embodiments, the buried layer 215 may be doped at a lower doping concentration than indicated above. The buried layer 215 should not be depleted during transistor action in order to maintain the insulating properties. The buried layer 215 may be arranged at a vertical distance with respect to the components of the first transistor 20. For example, the buried semiconductor layer 215 may be disposed at a distance to the first body region 220 and at a distance to the first drift zone 260. The distance between the first body region 220 and the buried layer 215 should be adjusted in order to provide the desired insulating characteristics.

According to a further embodiment, as will be discussed with reference to FIG. 3A, the buried semiconductor layer 315 of the second conductivity type may be disposed between the second substrate portion 113 and the body region 320 and the drift zone 360 of the second transistor 30. According to this embodiment, the buried semiconductor layer 315 is not disposed between the first substrate portion 112 and the first body region 220 and the first drift zone 260.

According to the embodiment of FIG. 1, the drain conductive material 115 deeply extends into the semiconductor substrate, e.g. to the first portion 112 of the semiconductor substrate. Further, the source conductive material 116 may deeply extend into the semiconductor substrate, e.g. to the second portion 113 of the semiconductor substrate. As a consequence, a parasitic bipolar transistor may be deteriorated or suppressed. For example, the first layer 129 comprising the first portion 112 and the second portion 113 may be doped at a doping concentration of 1e19 $cm^{-3}$. As a consequence, the heavily doped portions 112, 113 suppress a transistor e.g. a npn transistor which could otherwise be formed in this region. A doped portion 121, 122 of the first conductivity type may be disposed between the drain conductive material 115 and the first portion 112 of the semiconductor substrate and between the source conductive material 116 and the second portion 113 of the semiconductor substrate.

The drain contact groove 117 and the source contact groove 119 may be formed in the semiconductor substrate 100 from the first main surface 110 so as to extend into the depth direction, e.g. the z direction of the substrate 100. The depth of the drain contact groove 117 and of the source contact groove 119 may be larger than a depth of the gate trench 212. The depth of the drain contact groove 117 and of the source contact groove 119 may be approximately 3 to 20 µm, e.g. 4 µm.

An insulating material 253 may be formed over the first main surface 110 of the semiconductor substrate so that the first drain region 205 is not electrically coupled to a conductive material disposed at the first main surface 110 of the semiconductor substrate. Likewise, the second source region 301 may be disconnected from a conductive element at the top surface of the semiconductor device.

According to the embodiment shown in FIG. 1, the first drain region 205 and the second source region 301 are electrically connected to a conductive layer 130 disposed on the second main surface 120 of the semiconductor substrate 100 by means of the first drain contact portion 206 that includes a drain conductive material 115 in the drain contact groove 117 and the first portion 112 of the semiconductor substrate. Further, the second source region 301 is electrically connected to the conductive layer 130 disposed on the second main surface 120 of the semiconductor substrate 100 by means of the second source contact portion 302 that includes a source conductive material 116 in the source contact groove 119 and the second portion 113 of the semiconductor substrate. As a result, the first drain contact and the second source contact implement a vertical contact to the backside of the semiconductor device 1 by means of a low resistive drain conductive material 115 and a low resistive source conductive material 116 which are filled in the drain contact groove 117 and the source contact groove 119, respectively. The drain conductive material 115 and the source conductive material 116 may comprise a metal such as tungsten. Further examples of the source conductive material 116 and the drain conductive material 115 comprise polysilicon. Examples of the materials of the metallization layer comprise metals such as tungsten, optionally including suitable intermediate layers.

As has been mentioned above, power transistors generally comprise a plurality of transistor cells that are connected parallel to each other. Each of the transistor cells may have the structure as described herein with reference to the Figures shown. For example, a plurality of parallel transistor cells may be arranged along the second direction, e.g. the y direction and may be connected in parallel to form a transistor. Further transistor cells of the transistor may be disposed in a mirrored manner with respect to the drain region and the source region. In the context of the present specification, the term "semiconductor device" may refer to the single transistors 20, 30, the transistors comprising a plurality of transistor cells.

The first gate electrode 210 is insulated from the first body region 220 by means of the first gate dielectric layer 211. Likewise, the second gate electrode 310 is insulated from the second body region 320 by means of the second gate dielectric layer 311. The first gate electrode 210 my be electrically connected to a first gate terminal 213. The second gate electrode 310 of the second transistor may be electrically connected to a second gate terminal 313. The first transistor and/or the second transistor 30 may further comprise a field plate 250, 350. According to an embodiment, the first or the second field plate 250, 350 may be implemented as a planar field plate that is disposed over the first main surface 110 of the semiconductor substrate. According to a further embodiment, the field plate may be arranged in a field plate trench 252, 352, that extends in the semiconductor substrate. The field plate 250, 350 may be insulated from the drift zones 260, 360 by means of a field dielectric layer 251, 351.

The semiconductor device shown in FIG. 1 further includes a first and a second first body contact portion 225, 325. The first body contact portion 225 electrically connects the first body region 220 with the first source contact 202. The second body contact portion 325 electrically couples the second body region 320 to the second source contact 302. The first and the second body contact portions 225, 325 are doped with a first conductivity type. Due to the presence of the body contact portions 225, 325, the suppression of a parasitic bipolar transistor may be improved. The body contact portion 225, 325 may be implemented as a horizontal body contact portion 225b, 325b which is disposed as a portion of a correspondingly doped layer between the first and/or second body regions 220,320. A vertical body contact portion 225a, 325a will be explained below with reference to FIGS. 2B and 2C.

As is further shown in FIG. 1, according to an embodiment, an avalanche clamping diode 107 may be formed adjacent to the second drain contact 306. In more detail, the second drain region 305 of the second conductivity type, and the further substrate portion 114 of the first conductivity type of the semiconductor substrate form a pn diode 107 which may cause an avalanche breakdown in case of a breakdown of the semiconductor device. Thereby, an avalanche breakdown in the drift region may be avoided, which might lead to a drift of the device parameters. Thus, the characteristics of the device are improved. By setting a thickness of the respectively doped portions and by setting a doping concentration of the doped portions, the breakdown voltage may be adjusted. Alternatively, a corresponding avalanche clamping diode may be formed adjacent to the first source region 201 and form a component of the first transistor 20.

In the following, the structure of the first and second transistors 20, 30 will be explained in more detail while referring to FIGS. 2A to 2E. As is to be appreciated, the first and the second transistors 20, 30 may be very similar in structure. The first and the second transistors 20, 30 particularly differ from each other due to the different structure of the respective source and drain contacts. The first and the second transistors 20, 30 will be explained by explaining the structure of the second transistor 30.

Figure 2A:
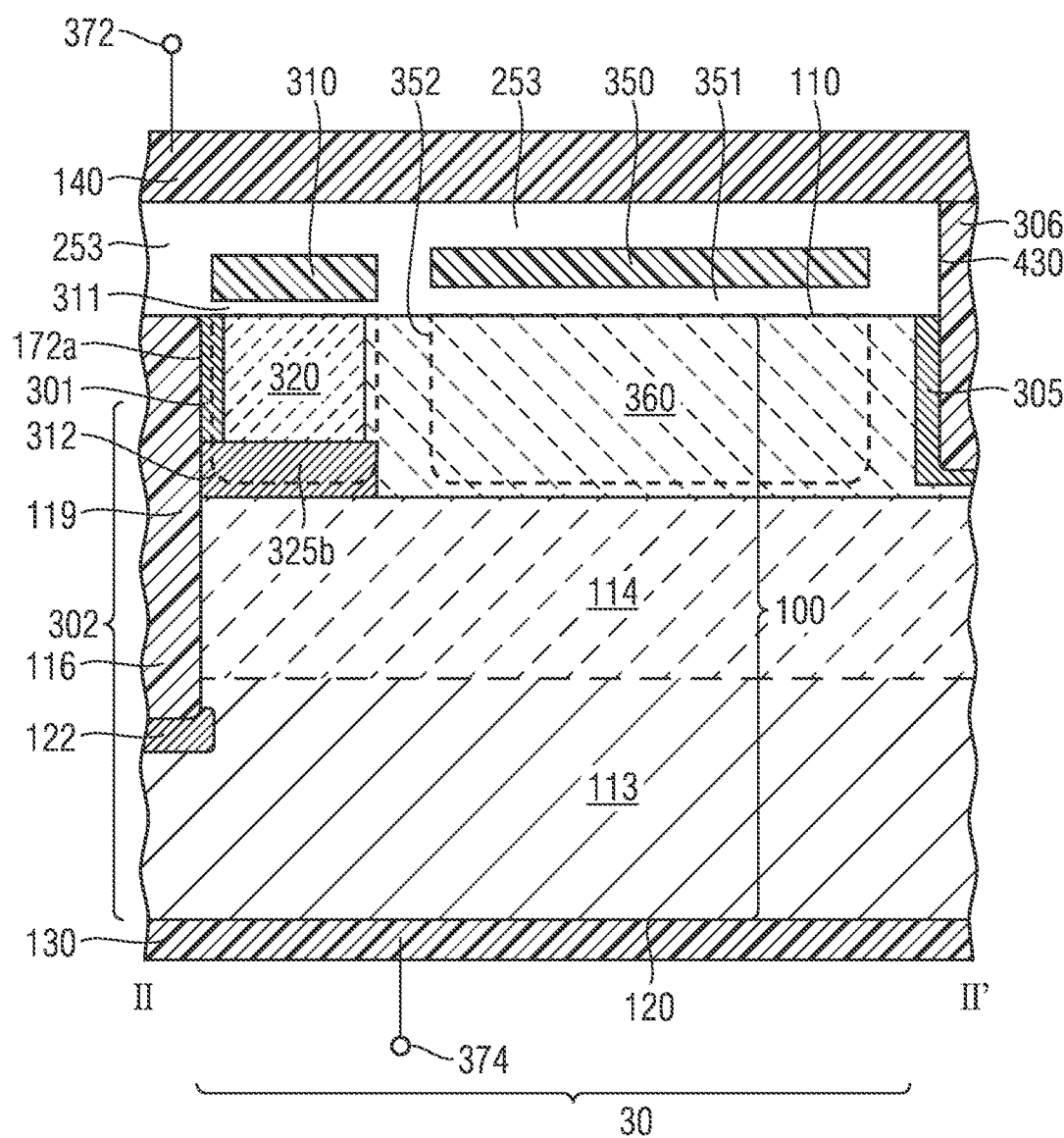
FIGS. 2A and 2B show a cross-sectional views of a transistor illustrated in FIG. 1.

FIG. 2A shows an enlarged view of components of the second transistor 30. The first and the second transistors 20, 30 may comprise a horizontal body contact portion 225b, 325b. Moreover, the first and the second transistors 20, 30 may further comprise a vertical body contact portion 225a, 325a. For example, the source contact trench (illustrated in FIG. 1) 203 may comprise a sidewall 171 having first and second sidewall portions 171a, 171b. The vertical body contact portions 225a may disposed adjacent to the second sidewall portions 171b, and the first source region 201 may be disposed adjacent to the first sidewall portions. In a similar manner, the source contact groove 119 includes first sidewall portions 172a and second sidewall portions 172b. As is illustrated in FIG. 2A, the second source regions 301 of the second transistor 30 is disposed adjacent to the first sidewall portion 172a.

Figure 2B:
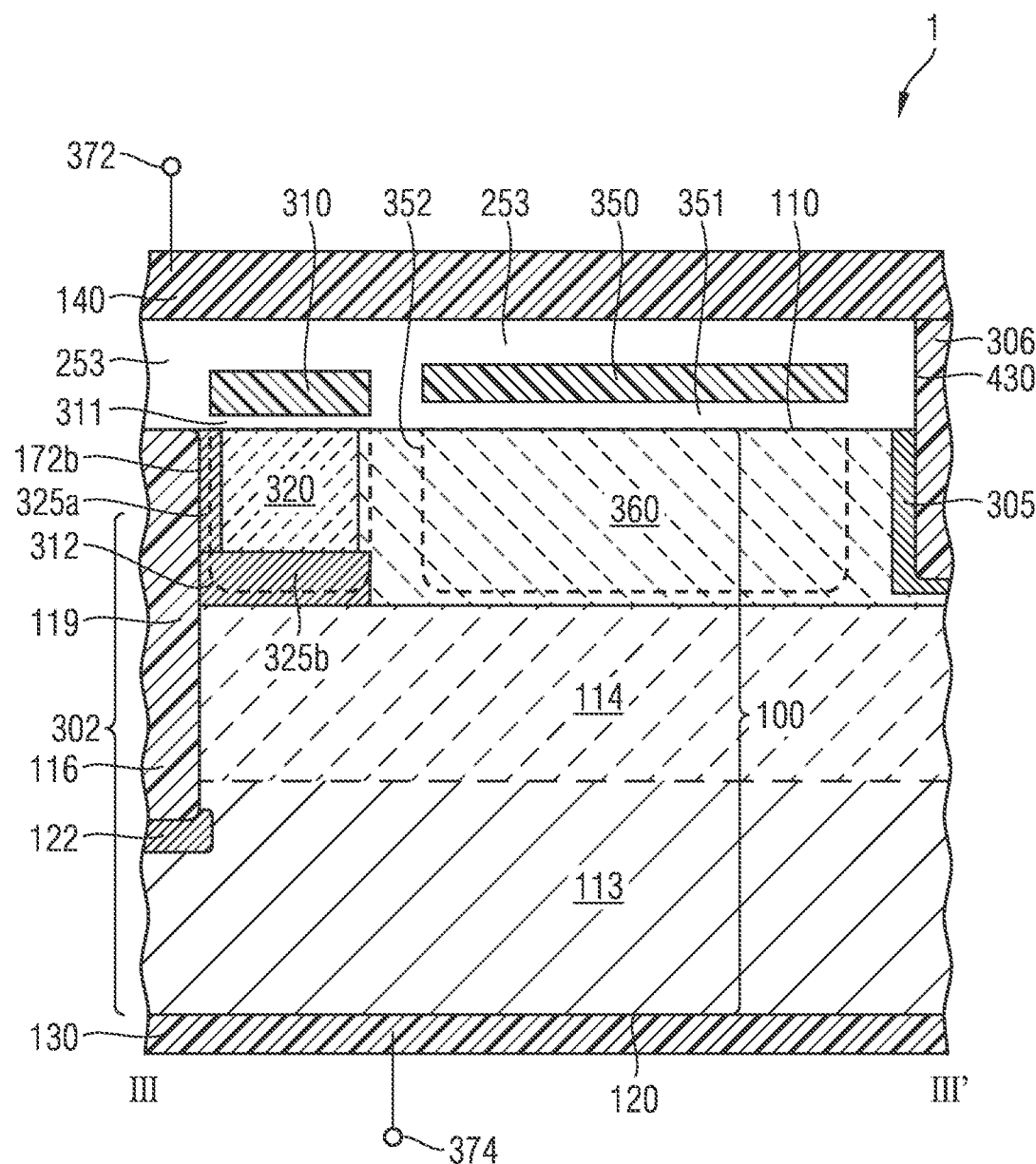
Figure 2C:
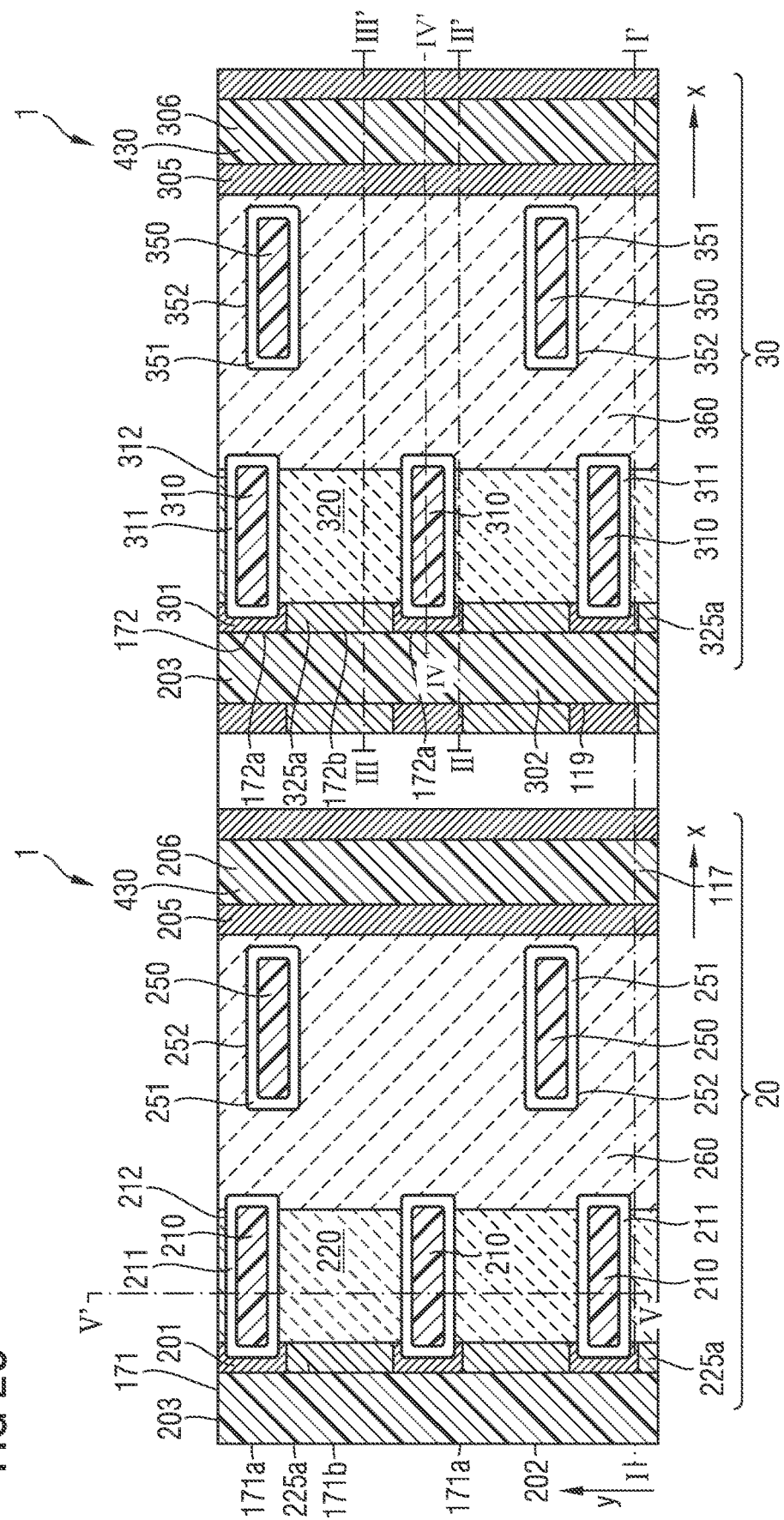
FIG. 2C shows a horizontal cross-sectional view of the semiconductor device shown in FIG. 1.

FIG. 2B shows a cross-sectional view of the second transistor shown in FIG. 1, the cross-sectional view being taken at a position which is shifted along a second direction perpendicular to the first direction. The cross-sectional view of FIG. 2B is taken between III and III', as is also illustrated in FIG. 2C. The cross-sectional view of FIG. 2B is taken so as to intersect a second portion 172b of the sidewall 172 of the source contact groove 119. Differing from the cross-sectional view shown in FIG. 2A, a vertical body contact portion 325a is formed adjacent to or in the second portion 172b of the sidewall of the source contact groove 119. Accordingly, the vertical body contact portion 325a vertically overlaps with the second source region 301. The wording "vertically overlaps with" is intended to mean that the respective portions or regions may extend in the same depth. In more detail, there may be a vertical extension of the semiconductor body at which the respective portions or regions may be present. To be more specific, the starting points of the respective portions or regions do not need to coincide. Further, the end points of the respective portions or regions do not need to coincide. The second body contact portion 325 is electrically connected to the second source contact. In a similar manner, the first body contact portion 225 is electrically connected to the first source contact.

Due to the presence of the body contact portion 225, 325 and, in particular due to the feature that the vertical body contact portion 225a, 325a vertically overlaps with the first source region 201 and the second source region 301, respectively, the suppression of a parasitic bipolar transistor may be improved. In more detail, holes may be efficiently removed from the body region, thereby preventing detrimental effects such as a snap-back effect. This results in an improved safe-operating area (SOA) that corresponds to a region in the I-V-characteristic in which the semiconductor device may be safely operated.

FIG. 2C shows a horizontal cross-sectional view of the semiconductor device illustrated in FIG. 1. As is shown, the semiconductor device 1 includes a source contact trench 203, a source contact groove 119, a drain contact groove 117 and a drain contact trench 430. The source contact groove 119 and the drain contact groove 117 extend in a second direction (e.g. the y direction) which is perpendicular to the first direction. Any of the grooves and trenches need not have strictly vertical sidewalls. In more detail, the sidewalls may also be inclined or rounded. For example, any of the grooves and trenches may be tapered.

The semiconductor device further includes first gate trenches 212 and second gate trenches 312 that are formed in the first main surface 110 of the semiconductor device. The semiconductor device further may comprise first and second field plate trenches 252, 352. A longitudinal axis of the gate trenches 212 and the field plate trenches 252 may extend in the first direction. The term "longitudinal axis" refers to a horizontal axis along which the respective trench has a greater extension length than in another horizontal direction. The first gate trenches 212 pattern the first body region 220 into a plurality of segments, e.g. ridges or fins. In a similar manner, the second gate trenches 312 pattern the second body region 320 into a plurality of segments, e.g. ridges or fins. Accordingly, as will be explained later in more detail, the first and the second transistors may be implemented as Fin Field Effect Transistors (FinFETs).

The sidewall 171 of the first source contact groove 119 may be segmented into first portions 171a and second portions 171b. The first source region 201 may be disposed adjacent to or in first portions 171a of the sidewall. Further, the first vertical body contact portion 225a may be disposed adjacent to or in second portions 171b of the sidewall 171. The distance between adjacent gate trenches 212, 312 may be different from a distance between adjacent field plate trenches 252, 352. A portion of the gate electrode 210, 310 may be disposed over the first main surface 110 of the semiconductor substrate and may extend in the second direction. Further, a portion of the field plate 250, 350 may be disposed over the first main surface 110 of the semiconductor substrate and may extend in the second direction. According to an embodiment, the first gate trenches 212 and the second gate trenches 312 may be disposed at the same position or at a different position which may, e.g. be measured along the second direction.

Figure 2D:
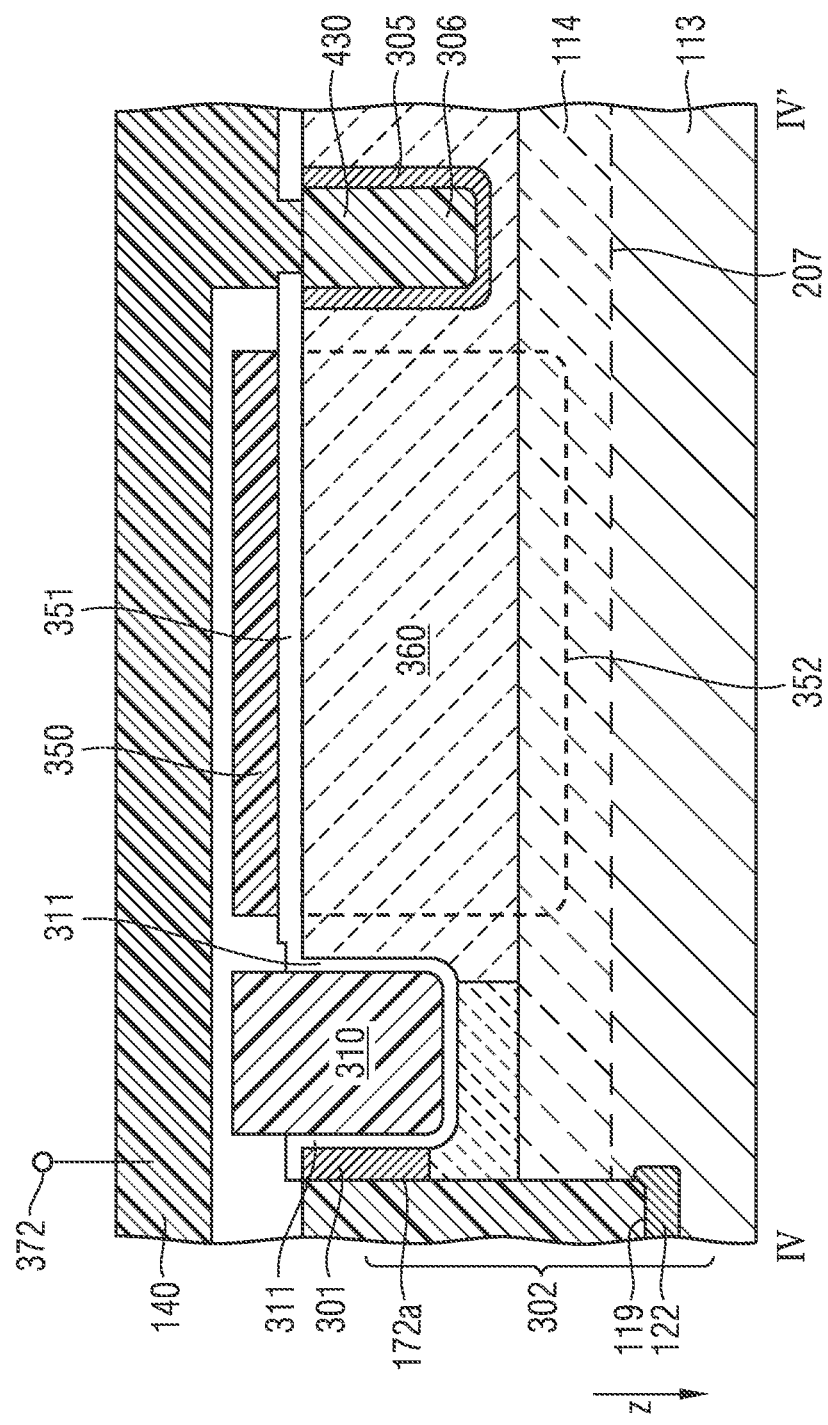
FIGS. 2D and 2E show cross-sectional views of a portion of the semiconductor device shown in FIG. 1.

FIG. 2D shows a cross-sectional view of the transistor shown in FIGS. 2A to 2C, the cross-sectional view being taken at a position so as to intersect the second gate trenches 312. The cross-sectional view of FIG. 2D is taken between IV and IV', as is also illustrated in FIG. 2C. The cross-sectional view of FIG. 2D shows the same components as FIGS. 2A and 2B. Further, the second gate trench 312 extends in the semiconductor substrate 100 in the depth direction, e.g. the z direction. FIG. 2D further shows modifications of the embodiment illustrated in FIGS. 2A to 2C. Differing from the structures shown in FIGS. 2A to 2C, the second field plate trench 352 (indicated by broken lines and being disposed before and behind the depicted plane of the drawing) may extend to the further portion 114 of the semiconductor substrate. For example, the second field plate trench 352 may extend to a depth that is deeper than the depth of the second drift zone 360. As a result, the second field plate 350 may vertically overlap with the further portion 114 of the semiconductor substrate.

According to a further modification, that may be independent from the depth of the field plate trench 252, 352 the drain contact trench 430 may extend to the further portion 114 of the semiconductor substrate. As a result, the second drain contact 306 may vertically overlap with the further portion 114 of the semiconductor substrate having the first conductivity type. For example, a semiconductor portion of the second conductivity type may be disposed adjacent to the second drain contact 306.

Figure 2E:
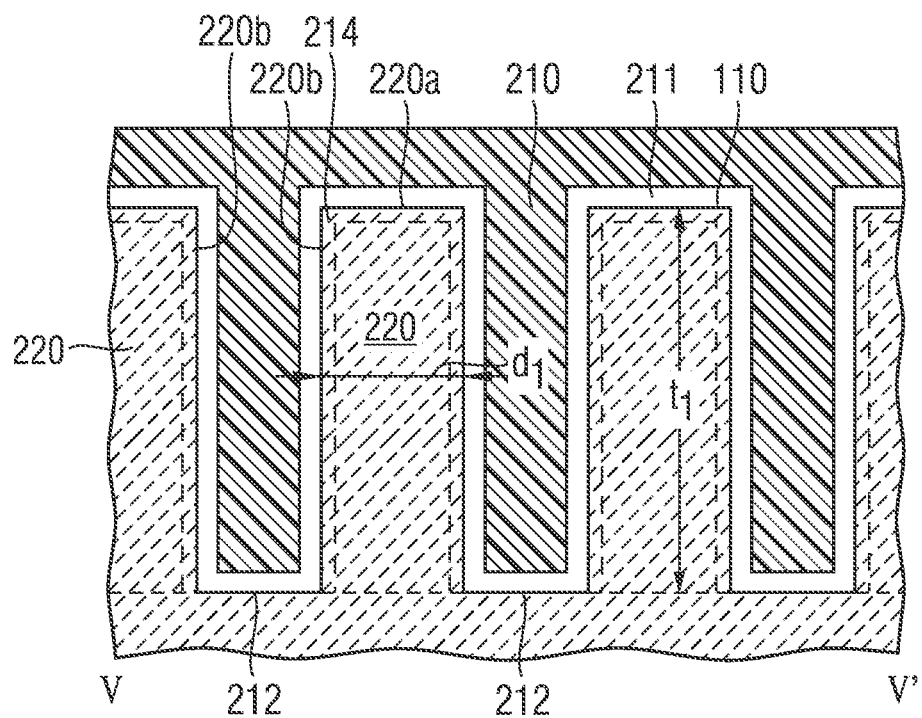

FIG. 2E shows a cross-sectional view which is taken along the second direction. The cross-sectional view of FIG. 2E is taken between V and V' as is illustrated in FIG. 2C so as to intersect a plurality of first gate trenches 212. As is to be clearly understood, the second gate trenches 312 may have the same shape, and a detailed description thereof is omitted. The first body region 220 forming the single ridges or fins may be patterned by adjacent first gate trenches 212. The ridges comprise a top surface 220a and sidewalls 220b. A first gate dielectric layer 211 is disposed adjacent to the sidewalls 220b and the top surface 220a of each of the ridges. A conductive material is filled in the trenches 212 between adjacent ridges to form the first gate electrode 210. As a result, the first body region 220 has the shape of a ridge extending in the first direction. Differently stated, a longitudinal axis of the ridges or the fins corresponds to the first direction.

The sidewalls 220b may extend perpendicularly or at an angle of more than 75° with respect to the first main surface 110. The first gate electrode 210 may be disposed adjacent to at least two sides of the ridge.

When the transistor is switched on, e.g. by applying as suitable voltage to the first gate electrode 210, a conductive inversion layer 214 (conductive channel) is formed at the boundary between the first body region 220 and the first gate dielectric layer 211. Accordingly, the field effect transistor is in a conducting state from the first source region 201 to the first drain region 205. In case of switching off, no conductive inversion layer is formed and the transistor is in a non-conducting state. According to an embodiment, the conductive channel regions 214 formed at opposing sidewalls 220b of a ridge do not merge with each other so that the first body region 220 may not be fully depleted and may be connected to the first source region and to the vertical body contact portion 225a.

For example, a distance between adjacent first gate trenches 212 that corresponds to a width d1 of the ridges may be larger than 200 nm, e.g. 200 to 2000 nm, for example, 400 to 600 nm. The transistor may further comprise a field plate. When the transistor is switched off, e.g. by applying a corresponding voltage to the gate electrode, carriers may be depleted from the drift zone. As a result, a doping concentration of the drift zone may be increased while maintaining the blocking capability of the transistor. As a result, the on-state resistance may be further reduced, while securing the high voltage blocking capability.

According to a further embodiment, the width d1 of the first body region 220 fulfills the following relationship: $d1 \leq 2*l_d$, wherein $l_d$ denotes a length of a depletion zone which is formed at the interface between the first gate dielectric layer 211 and the first body region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/k), T denotes the temperature (e.g. 300 K), ln denotes the natural logarithm, $N_A$ denotes the impurity concentration of the semiconductor body, $n_i$ denotes the intrinsic carrier concentration (1.45×10$^{10}$ cm$^{-3}$ for silicon at 27° C.), and q denotes the elementary charge (1.6×10$^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 10 to 200 nm, for example, 20 to 60 nm along the main surface 110 of the semiconductor substrate 100.

According to the embodiment in which the width $d1 \leq 2*ld$, the transistor is a so-called "fully-depleted" transistor in which the first body region 220 is fully depleted when the first gate electrode 210 is set to an on-voltage. In such a transistor, an optimal sub-threshold voltage may be achieved and short channel effects may be efficiently suppressed, which may result in improved device characteristics.

In the field effect transistors 20, 30 illustrated in FIGS. 2A to 2E, the first and second gate electrodes 210, 310 are disposed in gate trenches 212, 312 in the first main surface 110, to form FinFETs. The source regions 201, 301 vertically extend into the semiconductor substrate 100, and the drain regions 205, 305 vertically extend in the semiconductor substrate 100. As a result, the effective channel width and the volume of the drain extension of the transistor may be largely increased, thereby reducing the on-state resistance. Due to the specific implementation of the first drain contact portion and the second source contact portion each extending to the second main surface of the semiconductor substrate, the properties of the vertically extending source and drain regions may be further utilized.

The semiconductor device 1 illustrated with reference to FIGS. 1 and 2A to 2E includes a first transistor 20 comprising a plurality of single first transistor cells which may be connected in parallel and second transistor 30 comprising a plurality of single second transistor cells. the first transistor cells may be connected in parallel. The second transistor cells may be connected in parallel. The pattern of the first and second transistor cells 20, 30 may be repeated and mirrored along the first and the second directions. The first drain regions of parallel first transistor cells and the second source regions of parallel second transistor cells may be connected to the conductive layer 130 (e.g. a common back side metallization layer) which is formed adjacent to the second main surface 120 of the semiconductor substrate 100. The first source regions of parallel first transistor cells may be connected to the first front side conductive layer 135 that is disposed on a side of the first main surface 110 of the semiconductor substrate 100. Further, the second drain portions of adjacent second transistor cells may be connected to a second front side conductive layer 140 that is disposed on a side of the first main surface 110 of the semiconductor substrate 100. Accordingly, no specific patterning of the metallization layer is necessary for contacting transistor cells of the single transistors. As a result, the manufacturing process may be further simplified and cost may be reduced. The first gate electrode 210 may be electrically connected to a first gate terminal 213, and the second gate electrode 310 may be electrically connected to a second gate terminal 313. The field plate 250 may be, e.g. connected to the first source terminal 272. The second field plate 350 may be, e.g. connected to the second source or load terminal 374.

Figure 3A:
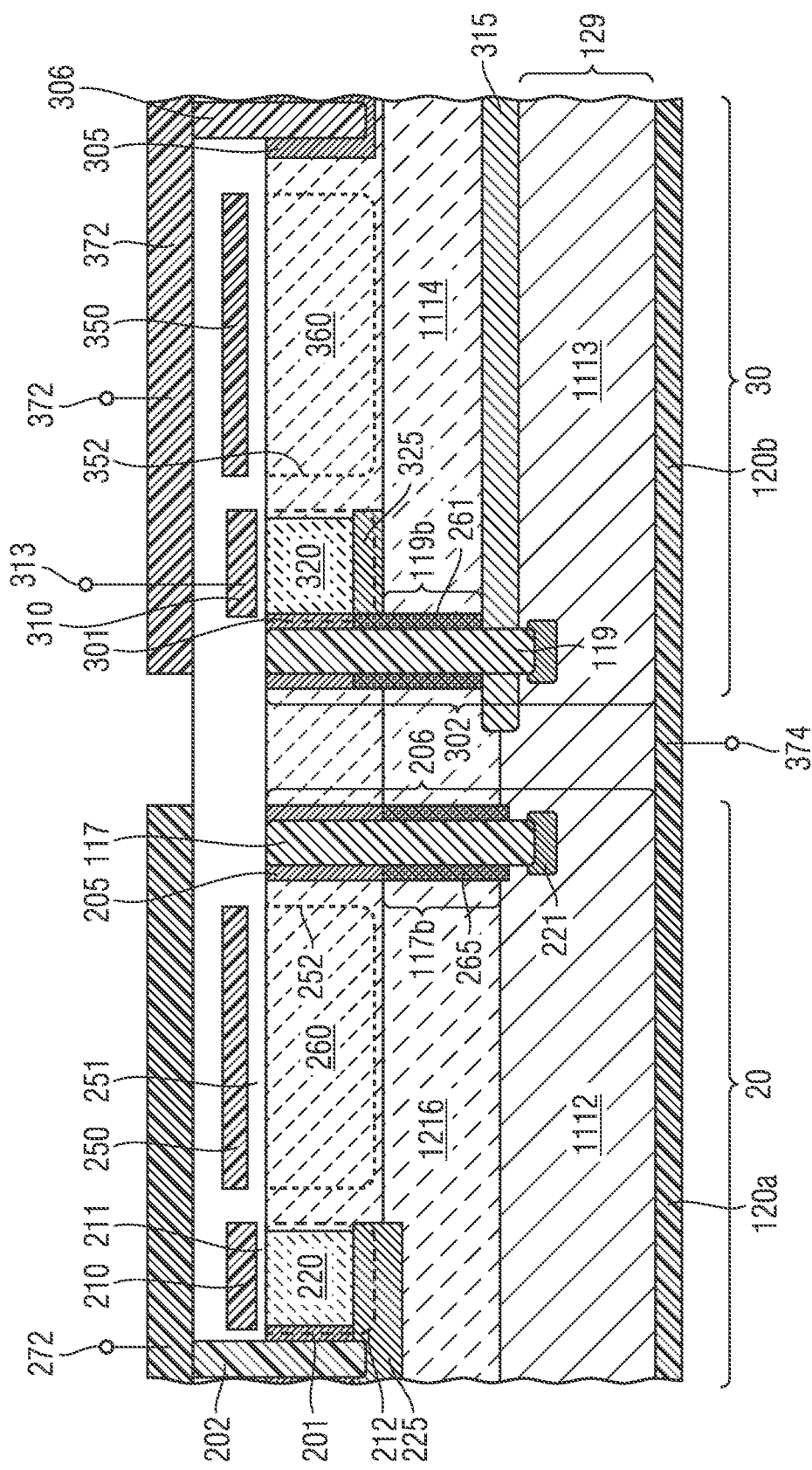
FIGS. 3A and 3B show cross-sectional views of a semiconductor device according to further embodiments, respectively.

FIG. 3A shows a cross-sectional view of a semiconductor device according to a further embodiment. Differing from the embodiment shown in FIG. 1, the first and second body regions 220, 320 now are of the second conductivity type, whereas the first substrate portion 1112 and the second substrate portion 1113 are of the first conductivity type. For example, the first and second substrate portions 1112, 1113 may be of $n^+$-conductivity type, whereas the body region may be of the p conductivity type. According to this embodiment, a buried layer 315 of the second conductivity type is disposed between the second substrate portion 1113 and the components of the second transistor 30. For example, the buried layer 315 of the second conductivity type may be of $p^+$ type conductivity. As a consequence, the second drain region 305 is effectively insulated from the first layer 129 that is electrically connected with the first drain region 205 and the second source region 301. The buried layer 315 is not disposed between the first substrate portion 1112 and the components of the first transistor 20. The third substrate portion 1216 and the further substrate portion 1114 may be of the first conductivity type, at a lower doping concentration than the first substrate portion 1112 and the second substrate portion 1113. The buried layer 315 may be disposed between the second substrate portion 1113 and the further substrate portion 1114.

According to the embodiment shown in FIG. 3A, a semiconductor substrate portion adjacent to the source conductive material 116 or the drain conductive material 115 is doped with the second conductivity type. For example, the corresponding dopants may be introduced via the sidewalls of the drain contact groove 117 or the source contact groove 119. The dopants may be of the second conductivity type so as to efficiently insulate the source conductive material 116 and the drain conductive material 115 from the adjacent substrate portions. According to the embodiment shown in FIG. 3A, the doped portion 265 is disposed adjacent to a lower part 117b of the drain contact groove 117. Further, the doped portion 261 is disposed adjacent to a lower part 119b of the source contact groove 119.

According to the embodiment shown in FIG. 3A, the first and second transistors 20, 30 may be formed in a substrate having a conductivity type that is different from the conductivity type of the body region 220, 320.

Figure 3B:
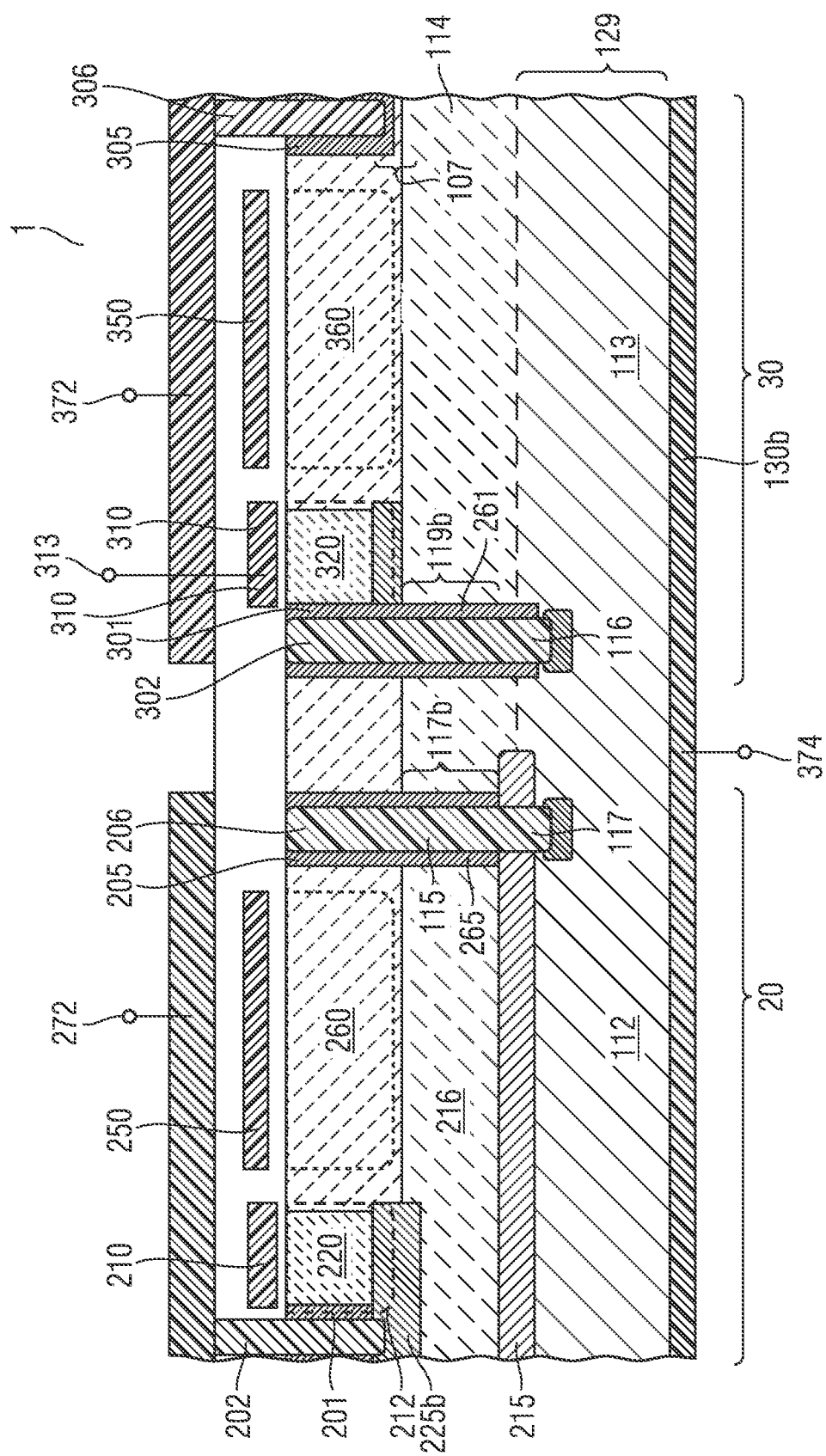

FIG. 3B shows a further embodiment according to which the third substrate portion 216 in contact with the first transistor 20 is of the first conductivity type. Further, the body regions 220, 320 are of the first conductivity type. As a result, the drift zone 260 of the first transistor 20 is adjacent to a semiconductor layer of the first conductivity type. The embodiment illustrated in FIG. 3B is very similar to the embodiment shown in FIG. 1 so that a detailed description thereof will be omitted. In particular, the semiconductor device 1 of FIG. 3B includes a buried layer 215 of the second conductivity type between the first layer 129 and the first transistor 20. The buried layer 215 is not disposed between the first layer 129 and the second transistor 30. Differing from the embodiment shown in FIG. 1, the semiconductor device includes a third substrate portion 216 of the first conductivity type adjacent to components of the first transistor 20. According to this embodiment, a doped portion 265 of the second conductivity type is disposed adjacent to the sidewalls of the lower part 117b of the drain contact groove 117 so as to provide an insulation between the drain conductive material 115 and the third substrate portion 216. Further, a doped portion 261 of the second conductivity type is disposed adjacent to sidewalls of the lower part 119b of the second source contact groove 119 so as to provide an electrical insulation between the source conductive material 116 and the further substrate portion 114.

As has been explained above, due to the presence of the semiconductor layer of the second conductivity type exclusively between the first substrate portion 112 and the first transistor 20 or exclusively between the second substrate portion 113 and the second transistor 30, each of the first and second transistors 20, 30 may be disposed over a substrate portion which is suitably doped for achieving insulation between source and drain region of the respective transistor.

The buried layer 215, 315 may be formed in an easy manner. For example, the buried layer 215 may be formed by an ion implantation step in which those portions of the semiconductor substrate, which are not to be implanted, are masked by a suitable masking layer. Thereafter, further steps are performed in order to manufacture the further components of the transistors. In particular, epitaxial processes are performed in order to manufacture further layers of the substrate in which the components of the transistors are to be formed. According to a further embodiment, the semiconductor layer may be formed by a diffusion process, e.g. from a phosphorous doped or arsenic doped glass. The doped portions 265, 261 may be formed by diffusion from boron glass disposed in the source contact groove or in the drain contact groove. According to a further embodiment, the dopants may be diffused from a boron containing gas phase.

The semiconductor device described herein, enables the monolithical formation of a half bridge circuit. In more detail, the first and the second transistors 20, 30 are disposed in a single semiconductor substrate 100. Due to the special structure in which the first source terminal and the second drain terminal are disposed adjacent to a first main surface 110 of the semiconductor substrate, whereas the first drain region is electrically connected to the second source region and may be contacted from a second main surface of the semiconductor substrate, a vertical semiconductor device is implemented. In particular, a vertical semiconductor device comprising two lateral transistors is implemented. In a lateral transistor a current flow parallel to the first main surface of the substrate is accomplished. For example, the source regions and the drain regions may be disposed adjacent to the first main surface. Further, the gate electrodes may have a longitudinal axis parallel to the first main surface. The respective source and drain regions may be contacted by means of a front side conductive layer and a back side conductive layer so that the half bridge may be contacted in an easy manner at a low resistance.

As is readily to be appreciated, the concept illustrated in FIG. 1 may also be applied to a planar transistor which optionally may comprise a drift zone. Accordingly, a semiconductor device 1 may comprise a first transistor 20 and a second transistor 30 in a semiconductor substrate 100 having a first main surface 110, the first transistor 20 and the second transistor 30 being of the same conductivity type. The first transistor 20 may comprise a first source region 201 adjacent to the first main surface, a first drain region 205, and a first drain contact portion 206 electrically connected to the first drain region 205. The second transistor 30 includes a second source region 301 and a second drain region 305 adjacent to the first main surface 110. The second transistor 30 further includes a first source contact portion 302 electrically connected to the second source region 301. The semiconductor substrate further includes a first semiconductor layer 129 of a first conductivity type. The first drain contact portion 206 and the first source contact portion 302 are electrically connected to the first semiconductor layer 129. The semiconductor substrate 100 further includes a buried layer 215, 315 of a second conductivity type. The buried layer 215 is disposed between the first transistor 20 and the first semiconductor layer 129 and is not disposed between the second transistor 30 and the first semiconductor layer. Alternatively, the buried layer 315 is disposed between the second transistor 30 and the first semiconductor layer 129 and is not disposed between the first transistor 20 and the first semiconductor layer.

The first semiconductor layer 129 may be disposed adjacent to a second main surface 120 of the semiconductor substrate 100 so that the first semiconductor layer 129 is disposed between the second main surface 120 and the buried layer 215, 315.

Moreover, a semiconductor device 1 may comprise a transistor 20 in a semiconductor substrate 100 having a first main surface 110. The transistor 20 may comprise a source region 201, a drain region 205, a first drain contact portion 206 electrically connected to the drain region 205, a body region 220, a drift zone 260, and a gate electrode 210. The gate electrode 210 may be disposed in a gate trench 212 in the first main surface adjacent to the body region 220. The gate electrode 210 may be configured to control a conductivity of a channel in the body region 220. A longitudinal axis of the gate trench 212 may extend in a first direction parallel to the first main surface. The body region 220 and the drift zone 260 may be disposed along the first direction between the source region 201 and the drain region 205. The first drain contact portion 206 includes a drain conductive material 115 in direct contact with the drain region 205 and a portion 112 of the semiconductor substrate 100, the portion 112 of the semiconductor substrate 100 being of a first conductivity type. The semiconductor device further includes a buried layer 215 of a second conductivity type between the portion 112 of the semiconductor substrate 100 and the transistor 20.

According to a further embodiment, a semiconductor device 1 includes a transistor 30 in a semiconductor substrate 100 having a first main surface 110. The transistor 30 includes a source region 301, a first source contact portion 302 electrically connected to the source region 301, a drain region 305, a body region 320, a drift zone 360, and a gate electrode 310. The gate electrode 310 is disposed in a gate trench 312 in the first main surface adjacent to the body region 320, the gate electrode 310 being configured to control a conductivity of a channel in the body region 320. A longitudinal axis of the gate trench 312 extends in a first direction parallel to the first main surface. The body region 320 and the drift zone 360 are disposed along the first direction between the source region 301 and the drain region 305. The first source contact portion 302 includes a source conductive material 116 in direct contact with the source region 301 and a portion 113 of the semiconductor substrate 100, the portion 113 of the semiconductor substrate 100 being of a first conductivity type. The semiconductor device further includes a buried layer 315 of a second conductivity type between the portion 113 of the semiconductor substrate and the transistor 30.

Figure 4:
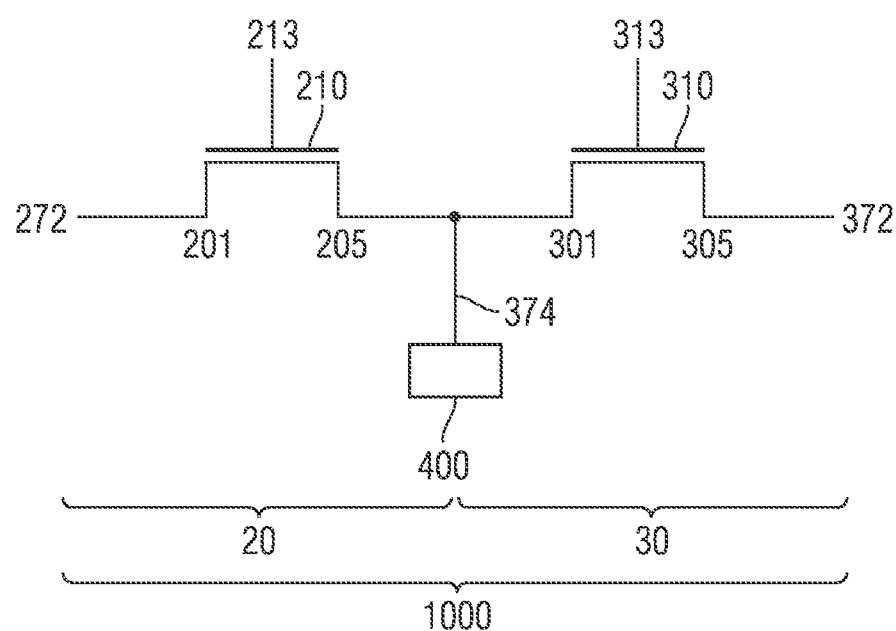
FIG. 4 shows an equivalent circuit diagram of an electric circuit comprising the semiconductor device shown in FIG. 1.

FIG. 4 shows an equivalent circuit diagram of the semiconductor device shown in FIG. 1. As is shown, the first transistor 20 and the second transistor 30 are connected so that the first drain region 205 and the second source region 301 are connected to a common terminal 374. The common terminal 374 may be also be referred to as a "phase terminal". The second drain region 305 may be connected to a drain terminal 372 which may be held at a supply potential. The first source region 201 may be connected to a source terminal 272 which may be ground. A first gate voltage may be applied to the first gate electrode 210 via a first gate terminal 213. Further, a second gate voltage may be applied to the second gate electrode 310 via a second gate terminal 313. For example, the phase terminal 374 may be connected to a load 400 such as a motor. In this configuration, the motor may be provided with forward and backward current. Accordingly, the semiconductor device shown in FIG. 1 implements an integrally formed half-bridge switch that may be used in a DC/DC converter, e.g. a buck or a boost converter. Moreover, the half bridge may be used in a switched mode power supply. An electric device as shown in FIG. 4 may implement, e.g. a DC/DC converter, a power supply or a motor drive.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising:
   a semiconductor substrate having a first main surface and a second main surface;
   a first transistor in the semiconductor substrate; and
   a second transistor in the semiconductor substrate,
   the first transistor comprising:
   a first drain contact electrically connected to a first drain region, the first drain contact comprising a first drain contact portion and a second drain contact portion;
   a first body region and a first drift zone disposed along a direction parallel to the first main surface between a first source region and the first drain region; and a first gate electrode in a first gate trench in the first main surface adjacent to the first body region;

wherein the second drain contact portion is disposed at the second main surface of the semiconductor substrate, and the first drain contact portion comprising a drain conductive material in direct contact with the first drain region, the first drain contact portion further comprising a first portion of the semiconductor substrate between the drain conductive material and the second drain contact portion, the second transistor comprising:

a second source contact electrically connected to a second source region, the second source contact comprising a first source contact portion and a second source contact portion;

a second body region and a second drift zone disposed along a direction parallel to the first main surface between the second source region and a second drain region;

a second gate electrode in a second gate trench in the first main surface adjacent to the second body region, wherein the second source contact portion is disposed at the second main surface of the semiconductor substrate, the first source contact portion comprising a source conductive material in direct contact with the second source region, the first source contact portion further comprising a second portion of the semiconductor substrate arranged between the source conductive material and the second source contact portion, wherein the first portion and the second portion of the semiconductor substrate are doped with a first conductivity type, and the semiconductor substrate further comprises a buried layer of a second conductivity type between the second portion of the semiconductor substrate and the second drift zone, the buried layer being absent from a region between the first portion of the semiconductor substrate and the first drift zone.

2. The semiconductor device according to claim 1, wherein the source conductive material of the first source contact portion is disposed in a source contact groove formed in the first main surface.

3. The semiconductor device according to claim 2, further comprising a source contact trench in contact with the first source region, the source contact trench extending from the first main surface to a depth smaller than a depth of the source contact groove.

4. The semiconductor device according to claim 1, wherein the drain conductive material of the first drain contact portion is disposed in a drain contact groove formed in the first main surface.

5. The semiconductor device according to claim 1, wherein the first and the second source regions and the first and the second drain regions are of an n conductivity type.

6. The semiconductor device according to claim 1, wherein the first and the second source regions and the first and the second drain regions are of a p conductivity type.

7. The semiconductor device according to claim 1, further comprising a first front side metallization layer in electrical contact with the first source region.

8. The semiconductor device according to claim 1, further comprising a doped semiconductor layer portion between the buried layer and the first or the second drift zone.

9. The semiconductor device according to claim 1, wherein the second source contact portion and the second drain contact portion are implemented by a conductive layer disposed in contact with the second main surface.

10. The semiconductor device according to claim 9, wherein the semiconductor device is implemented in an electric circuit comprising a load electrically connected to the conductive layer.

11. A semiconductor device comprising:

a semiconductor substrate having a first main surface and a second main surface;

a first transistor in the semiconductor substrate; and a second transistor in the semiconductor substrate, wherein the first and the second transistors being of a same conductivity type, the first transistor comprising:

a first source region adjacent to the first main surface; and a first drain contact portion electrically connected to a first drain region;

the second transistor comprising:

a second drain region adjacent to the first main surface; and a first source contact portion electrically connected to a second source region, the semiconductor substrate further comprising:

a first semiconductor layer of a first conductivity type, the first drain contact portion and the first source contact portion being electrically connected to the first semiconductor layer; and a buried layer of the second conductivity type between the first semiconductor layer and the second transistor, wherein the buried layer is absent from a region between the first semiconductor layer and the first transistor.

12. The semiconductor device according to claim 11, wherein the first semiconductor layer is disposed adjacent to the second main surface of the semiconductor substrate so that the first semiconductor layer is disposed between the second main surface and the buried layer.

13. The semiconductor device according to claim 11, wherein the first drain contact portion extends through the buried layer.

14. The semiconductor device according to claim 11, wherein the first and the second source regions and the first and the second drain regions are of the second conductivity type.

15. The semiconductor device according to claim 11, wherein the first and the second source regions and the first and the second drain regions are of the first conductivity type.

16. The semiconductor device according to claim 11, further comprising a conductive layer in contact with the second main surface, the first semiconductor layer being electrically connected with the conductive layer.

17. The semiconductor device according to claim 11, wherein the semiconductor device is implemented in an electric circuit comprising a load electrically connected to the conductive layer.

* * * * *